United States Patent [19]
Podoloff et al.

[11] Patent Number: 5,965,952
[45] Date of Patent: Oct. 12, 1999

[54] VEHICLE HORN AND CONTROL FUNCTION SWITCH WITH COMPENSATION AND METHOD OF OPERATION

[75] Inventors: Robert Michael Podoloff, Framingham, Mass.; Tex Kevin Monroe, Lakeland, Fla.

[73] Assignee: Breed Automotive Technology, Inc., Lakeland, Fla.

[21] Appl. No.: 09/130,181

[22] Filed: Aug. 6, 1998

[51] Int. Cl.[6] .................................................. B60R 21/16
[52] U.S. Cl. ........................ 307/10.1; 280/728.3; 338/50
[58] Field of Search .................................. 307/9.1, 10.1, 307/116, 119; 361/170, 179; 338/2, 50; 280/731, 735, 736, 743.1, 728.1–728.3; 200/61.54–61.56, 511–517

[56] References Cited

U.S. PATENT DOCUMENTS

| | | | |
|---|---|---|---|
| 5,398,962 | 3/1995 | Kropp | 200/61.54 |
| 5,463,258 | 10/1995 | Filion et al. | 307/10.1 |
| 5,489,806 | 2/1996 | Harris et al. | 307/101.1 |
| 5,539,259 | 7/1996 | Filion et al. | 307/10.1 |
| 5,576,684 | 11/1996 | Langford | 338/50 |
| 5,625,333 | 4/1997 | Clark et al. | 338/2 |
| 5,639,998 | 6/1997 | Ricks et al. | 200/61.54 |

*Primary Examiner*—Richard T. Elms
*Attorney, Agent, or Firm*—L. R. Drayer

[57] ABSTRACT

A vehicle horn and control function switch that has compensation for wide temperature variations and preloads from surrounding material due to manufacturing processes and material aging. Due to the very thin physical thickness of the force sensor, the switch is useful when the sensors are mounted on the hub of a vehicle steering wheel adjacent to an airbag assembly. The switch comprises a force sensor and a temperature sensor mounted in the hub of a steering wheel. The force sensor is connected to the input of an operational amplifier that has an offsetting input network and an amplifying feedback network that are controlled from a programmable microcontroller. The output of the operational amplifier and the temperature sensor are connected to the programmable microcontroller. In operation, the programmable microcontroller reads a temperature signal from the temperature sensor and a quiescent force signal from the output of the operational amplifier and compensates the offsetting and amplifying of the operational amplifier for temperature variations and effects of preload conditions, respectively. When an actuating force signal applied to the force sensor, the force signal at an input to the programmable microcontroller exceeds a predetermined threshold and the programmable microcontroller activates an output, causing a horn or other control function to actuate.

25 Claims, 5 Drawing Sheets

VEHICLE HORN AND CONTROL FUNCTION SWITCH WITH COMPENSATION AND METHOD OF OPERATION

BACKGROUND

The invention relates generally to vehicle horn and control function switch apparatus and, more particularly, to a vehicle horn and control function switch apparatus for steering wheel applications with compensation for effects of temperature and pre-loading. The invention also relates to a method of operation for the compensated switch apparatus.

From the advent of motor vehicles, there was a recognized need to gain the attention of people and animals that were in the path of a vehicle. As a result, the horn became a standard safety feature of motor vehicles, and was most swiftly and conveniently operated by a mechanical switch positioned in the center of the vehicle steering wheel. In more recent times, the airbag became another standard safety feature of motor vehicles. The most convenient location for the driver side airbag was the center of the vehicle steering wheel, collocated with the horn switch and other vehicle controls. In order to accommodate this addition, automotive designers turned to very thin electronic switch devices for horn actuation that could easily be positioned over an airbag cover. However, these devices suffered from the effects of temperature changes and static forces from adjacent components resulting from the manufacturing process or material aging characteristics.

These very thin electronic switch devices are usually fabricated from membrane material, piezoelectric elements, or pressure sensitive resistive ink, and require supporting electronic circuitry in order to function. U.S. Pat. Nos. 5,463,258 and 5,539,259 disclose identical circuits for sensing a resistive change in a force transducer due to applied forces, for turning on a transistor switch, for energizing a relay, and for activating a horn. Neither patent discloses any means of temperature or preload force compensation.

For reliable operation over extreme temperature ranges encountered in vehicle applications, compensation schemes are required for the very thin electronic switch devices. One such compensation scheme is described in U.S. Pat. No. 5,576,684. This scheme makes use of a flexible potentiometer that changes resistance as its shape changes as the user presses against the steering wheel hub cover. The horn control circuit responds to extremely rapid changes in the resistance of the flexible potentiometer, but not to more gradual changes caused by, for example, temperature changes. An analog to digital converter and a microprocessor are the primary circuit control components. Another similar approach is described in U.S. Pat. No. 5,398,962. The apparatus comprises a force sensor fabricated from pressure sensitive resistive material and disposed in a cover assembly mounted on the steering wheel. The sensor is connected to a circuit for sensing the change in applied force to the sensor during a predetermined wait period, for determining whether the change has reached a selected threshold value, and for activating or deactivating a horn if the change at least equals the selected threshold value. Yet another approach is disclosed in U.S. Pat. No. 5,489,806, which discloses a pressure or deflection sensitive horn switch with temperature compensation to compensate for changes in the plastic airbag cover stiffness due to changes in temperature. The sensors comprise both a temperature sensing device and a horn switch deflection sensing device operated by applied force mounted on the airbag cover surface and connected to an analog to digital converter controlled by a microprocessor. The microprocessor evaluates and compares the temperature and deflection signals to determine if the deflection of the cover surface is sufficient, when compensating for change in cover stiffness due to temperature change of the cover surface, to actuate a horn. Although these approaches provide for some temperature variation, it is not apparent that the wide sensor conductance variations with temperature of these sensing devices can be accommodated. There is also no disclosure of compensation for variations in preload forces due to manufacturing processes or material aging. Another related problem not addressed is the ability to maintain the maximum dynamic range of the force sensor relative to the fixed operating range of the supporting circuitry for all operating temperatures and preload conditions.

For reliable operation over extreme temperature ranges encountered in vehicle applications, there is a need for a horn and control function switch temperature compensation means that enables reliable operation over a temperature range from about −40° C. to about +85° C. In order to account for changes in preload forces resulting from the manufacturing process or vehicle component material aging, a horn and control function switch preload compensation means must enable reliable operation over a range of applied force to the switch sensor of from 1 Kg up to 5 Kg. Since, upon an applied force to the switch sensor of from 1 Kg up to 5 Kg, a typical resistance range of a horn and control function switch sensor is from 39 Kohms to 188 Kohms at −40° C., and from 2 Kohms to 12 Kohms at 85° C., there is a need to match this extremely wide dynamic sensor operating range to the fixed operating range of the control circuitry with suitable dynamic range compensation means. In addition to these requirements, the horn and control function switch, and associated circuitry must be easily and inexpensively fabricated, assembled, tested, calibrated, and installed.

SUMMARY

The present invention is directed to an apparatus and method of operation that satisfies these needs. The present invention provides for a horn and control function switch that operates reliably over extreme temperature ranges encountered in vehicle applications by incorporating temperature compensation means that enables reliable operation over a temperature range from about −40° C. to about +85° C. In order to account for changes in preload forces resulting from the manufacturing process or vehicle component material aging, the present invention has a preload compensation means which enables reliable operation over a range of applied force to the switch sensor of from 1 Kg up to 5 Kg. Since, upon an applied force to the switch sensor of from 1 Kg up to 5 Kg, a typical resistance range of a horn and control function switch sensor is from 39 Kohms to 188 Kohms at −40° C., and from 2 Kohms to 12 Kohms at 85° C., the present invention has the capability to match this extremely wide dynamic sensor operating range to the fixed operating range of the control circuitry with suitable dynamic range compensation means. This results in a compensation scheme that enables optimization of the dynamic range of the force signal at the input to the programmable microcontroller. This temperature and preload compensation scheme also reduces the resolution requirements of the electronic circuitry resulting in reduced costs. This arrangement also provides for ease of initial setup in the manufacturing operation. In addition to these requirements, the present invention is easily and inexpensively fabricated, assembled, tested, calibrated, and installed.

A device having features of the present invention comprises: a means for measuring a force applied to a surface of a steering wheel and generating a force signal; a means for measuring a temperature of the surface of the steering wheel and generating a temperature signal; a means for receiving the force signal and amplifying and offsetting the force signal; a means for receiving the temperature signal and compensating the amplifying and offsetting of the force signal depending on the temperature signal and a quiescent force signal; and a means for determining when the compensated force signal exceeds a threshold value and actuating a horn. The means for measuring a force applied to a surface of a steering wheel can be a pressure sensor, or more particularly, a force sensing resistive device. The means for measuring the temperature of the surface of the steering wheel is a temperature sensor, and more particularly, a thermistor. The means for amplifying and offsetting the force signal is a biased inverting operational amplifier with adjustable offset and gain, while the means for receiving the temperature signal and compensating the amplifying and offsetting of the force signal is a programmable microcontroller. The means for receiving the temperature signal and compensating the amplifying of the force signal is by a programmable microcontroller that selects resistors in a feedback network of a biased inverting operational amplifier based on the received temperature signal, and the compensated force signal at the biased inverting operational amplifier output is applied to an input of the programmable microcontroller. The resistors in a feedback network may also be a programmable digital potentiometer in a feedback network. The means for receiving the temperature signal and compensating the offsetting of the force signal is by a programmable microcontroller that selects resistors in an input network of a biased inverting operational amplifier based on the received quiescent force signal, and the compensated force signal at the biased inverting operational amplifier output is applied to an input of the programmable microcontroller. The resistors in an input network may also be a programmable digital potentiometer in an input network. The means for determining when the compensated force signal exceeds a threshold and actuating a horn is a programmable microcontroller. The means for actuating a horn may further comprise a means for actuating a control function selected from the group consisting of a lighting control function, an audio entertainment control function, a speed control function, and a temperature control function.

In an alternate embodiment of the invention, a method of operation of the invention comprises the steps of: measuring a force applied to a surface of a steering wheel and generating a force signal; measuring a temperature of the surface of the steering wheel and generating a temperature signal; receiving the force signal and amplifying and offsetting the force signal; receiving the temperature signal and compensating the amplifying and offsetting of the force signal depending upon the temperature signal and a quiescent force signal; and determining when the compensated force signal exceeds a threshold value and actuating a horn. The step of receiving the force signal and amplifying and offsetting the force signal comprises the steps of: applying the force signal to an input of a biased inverting operational amplifier; adjusting the amplifying of the force signal by selecting resistors in a feedback network of the biased inverting operational amplifier; and adjusting the offsetting of the force signal by selecting resistors in an input network of the biased inverting operational amplifier. The step of receiving the temperature signal and compensating the amplifying and offsetting of the force signal depending upon the temperature signal and a quiescent force signal comprises the steps of: applying the temperature signal to an input of a programmable microcontroller; selecting resistors in an input network of a biased inverting operational amplifier by the programmable microcontroller based on a quiescent force signal; and selecting resistors in a feedback network of the biased inverting operational amplifier by the programmable microcontroller based on the temperature signal. The step of determining when the compensated force signal exceeds a threshold value and actuating a horn comprises the steps of: applying the compensated force signal to an input of a programmable microcontroller; comparing the compensated force signal to a predetermined threshold by the programmable microcontroller; and actuating a horn if the compensated force signal exceeds the predetermined threshold by enabling a horn activating signal from the microcontroller.

In another embodiment, the invention comprises: a force sensing device for measuring a force applied to a surface of a steering wheel and generating a force signal, connected to an input of a biased inverting operational amplifier; a compensated force signal at the output of the biased inverting operational amplifier connected to a first input of a programmable microcontroller; a temperature sensing device for measuring temperature of the surface of the steering wheel and generating a temperature signal, connected to a second input of the programmable microcontroller; an amplifying determining feedback network connected between the output and the input of the biased inverting operational amplifier, the feedback network being controlled from a first output of the programmable microcontroller; an offset determining input network connected to the input of the biased inverting operational amplifier, the input network being controlled from a second output of the programmable microcontroller; a third output of the programmable microcontroller connected to an input of a horn actuator; and an output of the horn actuator connected to a horn. The force sensing device may be a force sensing resistive device. The temperature sensing device may be a thermistor. The feedback network may be a plurality of resistor elements selectively connected to ground by connections to the first output of the programmable controller. The feedback network may also be a programmable digital potentiometer connected to the first output of the programmable controller. The input network may be a plurality of resistor elements selectively connected to ground by connections to the second output of the programmable controller. The input network may also be a programmable digital potentiometer connected to the second output of the programmable controller. The programmable microcontroller may perform the steps of: reading the compensated force signal connected to the first input of the programmable microcontroller; comparing the compensated force signal with a predetermined threshold value; actuating the horn by activating the third output of the programmable microcontroller and returning to the first step if the compensated force signal is equal to or greater than predetermined threshold value indicative of an actuating compensated force signal; silencing the horn by deactivating the third output of the programmable microcontroller if the compensated force signal is less than the predetermined threshold value indicative of a quiescent compensated force signal; adjusting the selection of the offset determining input network resistors controlled from the second output of the programmable microcontroller based on the quiescent compensated force signal; reading the temperature signal connected to the second input of the programmable microcontroller; adjusting the selection of the amplifying determining feedback network resistors controlled from the first output of the programmable microcontroller based on the temperature signal; and returning to the first step.

BRIEF DESCRIPTION OF THE DRAWINGS

These and other features, aspects, and advantages of the present invention will become better understood with regard to the following description, appended claims, and accompanying drawings where:

DETAILED DESCRIPTION

Figure 1:
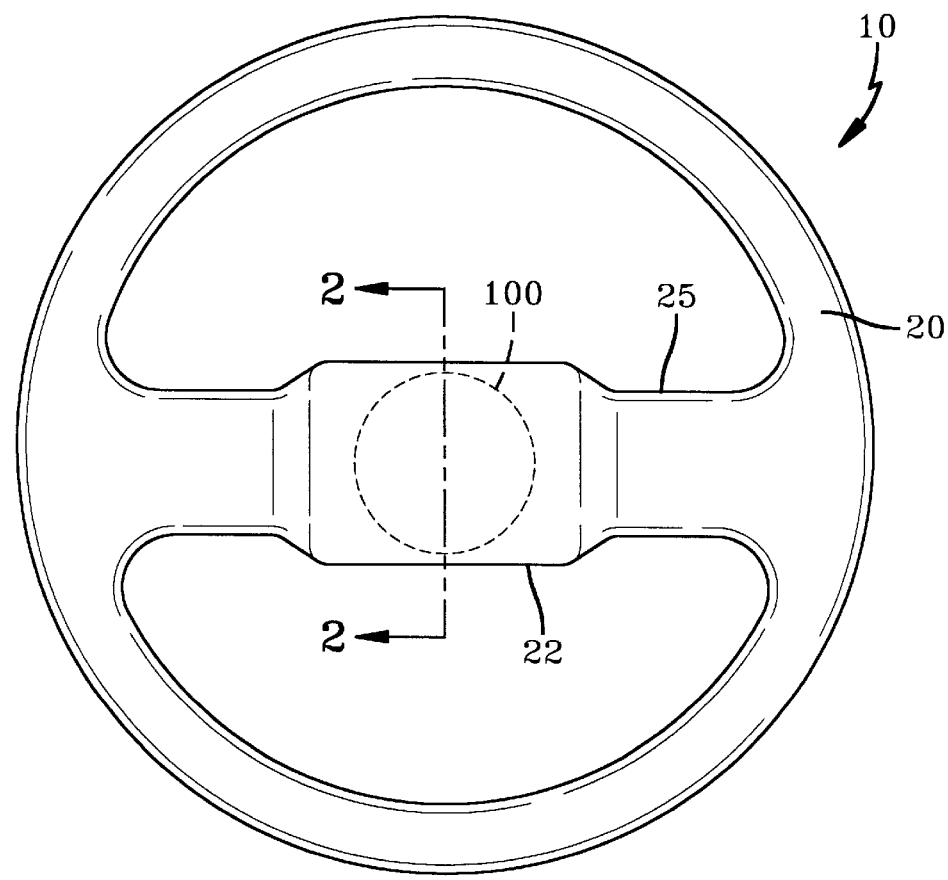
FIG. 1 shows a view of a vehicle steering wheel with airbag assembly.

Turning now to FIG. 1, a view of a vehicle steering wheel assembly 10 is shown having an outer perimeter 20 and a hub 22. Within the center of the hub 22 is an airbag assembly 100 molded into the hub 22 with molding material 25. Lines 2—2 are cutting plane lines identifying the location of the sectional drawing shown in FIG. 2.

Figure 2:
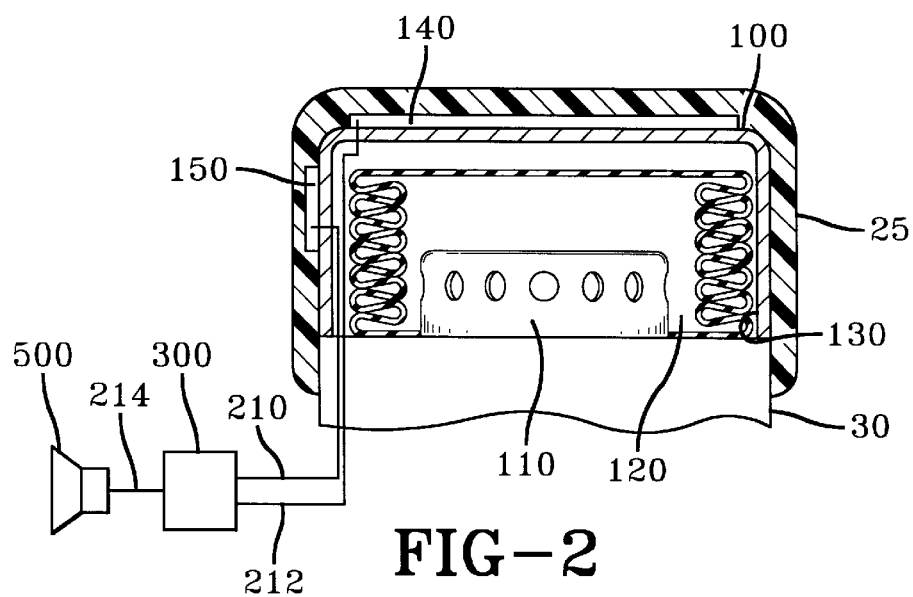
FIG. 2 shows a cross sectional view of a steering wheel mounted airbag assembly with force and temperature sensors connected to associated electronics circuitry and horn.

FIG. 2 shows a sectional view of a steering wheel mounted airbag assembly 100 with force sensor 140 and temperature sensor 150. The airbag assembly 100 has an airbag inflator 110 and an airbag 120 contained within a housing 130. Mounted to the housing 130 is a force sensor 140 and a temperature sensor 150 that are electrically connected to associated electronics circuitry 300 by force signal connections 212 and temperature signal connections 210. The airbag assembly 100, force sensor 140, and temperature sensor 150 are enclosed in molding material 25 and mounted onto a steering column 30. The electronics circuitry is electrically connected to a horn 500 by a horn actuation signal 214. Although not shown, there may be more than a single force sensor in the configuration shown in FIG. 2. These other sensors are connected to electronics circuitry in a similar fashion to that shown in FIG. 2, but are used to actuate other control functions such as lighting control functions, entertainment audio control functions, speed control functions, and temperature control functions.

Figure 3:
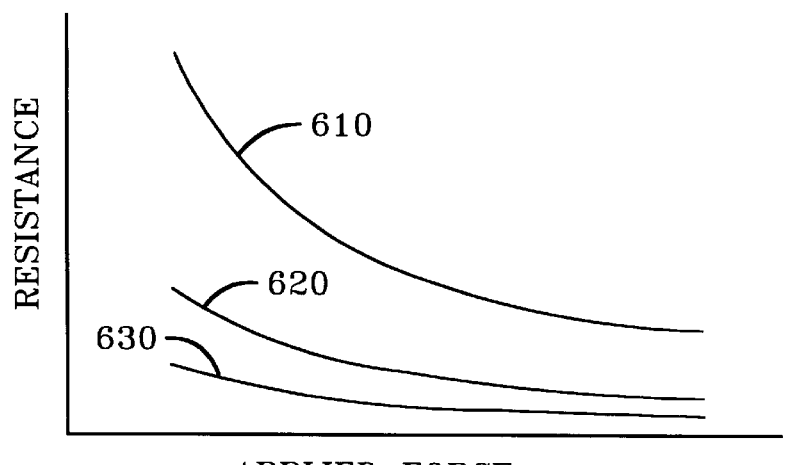
FIG. 3 shows the resistance characteristics of a typical force sensitive resistive device over a normal range of applied force at three operating temperatures.

Turning now to FIG. 3, FIG. 3 shows the resistance characteristics of a typical force sensitive resistive sensor over a normal range of applied force at three operating temperatures. The upper curve 610 depicts the variation of resistance with applied force from about 1.0 Kg to about 5.0 Kg at a temperature of −40° C. The middle curve 620 depicts the variation of resistance with applied force from about 1.0 Kg to about 5.0 Kg at a temperature of 25° C. The lower curve 630 depicts the variation of resistance with applied force from about 1.0 Kg to about 5.0 Kg at a temperature of 85° C. The wide variations in resistance due to temperature at any given force are apparent from this depiction.

Figure 4:
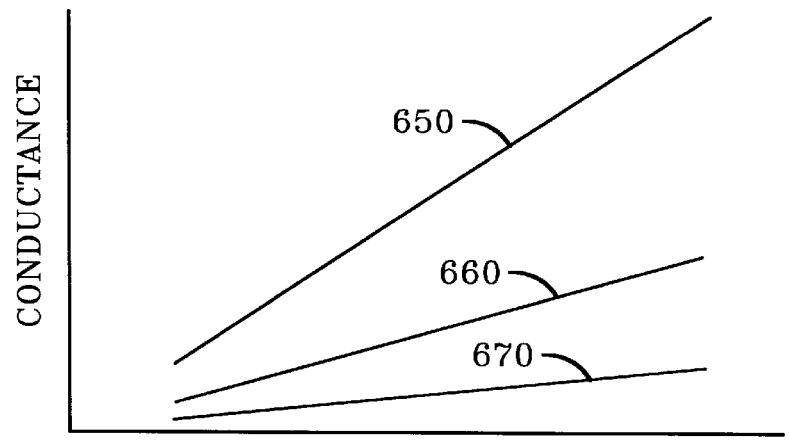
FIG. 4 shows the conductance characteristics of a typical force sensitive resistive device over a normal range of applied force at three operating temperatures.

Turning now to FIG. 4, FIG. 4 shows the conductance characteristics of a typical force sensitive resistive sensor over a normal range of applied force at three operating temperatures. These curves depict the same information as depicted in FIG. 3, but plotted as conductance which is the reciprocal of resistance. These curves depict more clearly the effective change in the sensitivity or gain with temperature with no preload forces. The upper curve 650 depicts the variation of conductance with applied force from about 1.0 Kg to about 5.0 Kg at a temperature of 85° C. The middle curve 660 depicts the variation of conductance with applied force from about 1.0 Kg to about 5.0 Kg at a temperature of 25° C. The lower curve 670 depicts the variation of conductance with applied force from about 1.0 Kg to about 5.0 Kg at a temperature of 40° C. By connecting an input of a variable gain amplifier to this force sensitive resistive sensor and selecting an appropriate gain of the amplifier corresponding to each temperature shown, the curves could be made to coincide with one another, thus compensating for the variation in conductance (resistance) with temperature. Note that with no preload force, these three curves would have zero conductance at zero applied force, and therefore, passing through the origin.

Figure 5:
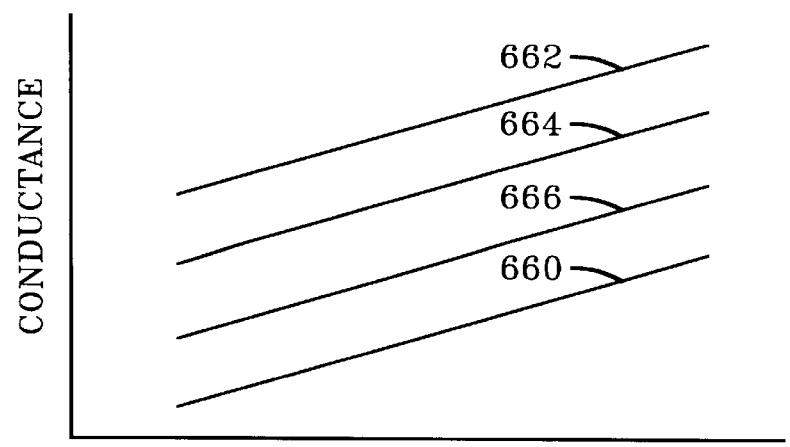
FIG. 5 shows the conductance characteristics of a typical force sensitive resistive device at a temperature of 25° C. over a normal range of applied force at four different levels of preload forces.

Turning now to FIG. 5, FIG. 5 shows the conductance characteristics of a typical force sensitive resistive sensor device over a normal range of applied force at four different levels of preload forces at a temperature of 25° C. The upper curve 662 depicts the variation of conductance with applied force from about 1.0 Kg to about 5.0 Kg at 25° C. with a preload force of 5.0 Kg. The upper-middle curve 664 depicts the variation of conductance with applied force from about 1.0 Kg to about 5.0 Kg at 25° C. with a preload force of 3.0 Kg. The lower-middle curve 666 depicts the variation of conductance with applied force from about 1.0 Kg to about 5.0 Kg at 25° C. with a preload force of 1.0 Kg. The lower curve 660 depicts the variation of conductance with applied force from about 1.0 Kg to about 5.0 Kg at 25° C. with a preload force of 0.0 Kg. This latter curve 660 is the same as the middle curve 660 shown in FIG. 4. The quiescent state of the force sensor is where the applied force of these curves is zero and intersects with the vertical axis. Thus, the quiescent force signal of the upper curve 662 is 5.0 Kg, the quiescent force signal of the upper middle curve 664 is 3.0 Kg, the quiescent force signal of the lower middle curve 666 is 1.0 Kg, and the quiescent force signal of the lower curve 660 is 0.0 Kg. By connecting an input of an amplifier having an adjustable offset to this force sensitive resistive sensor and selecting an appropriate offset of the amplifier corresponding to each preload force shown, the curves could be made to coincide with one another, thus compensating for the variation in conductance (resistance) with preload force. The conclusion from these considerations of FIG. 4 and FIG. 5 is that both temperature and preload variations on the conductance of a force sensitive resistive sensor can be compensated for by connecting the force sensor to an input of an amplifier having adjustable gain and offset, and appropriately adjusting the amplifying (gain) and offsetting of the amplifier.

Figure 6:
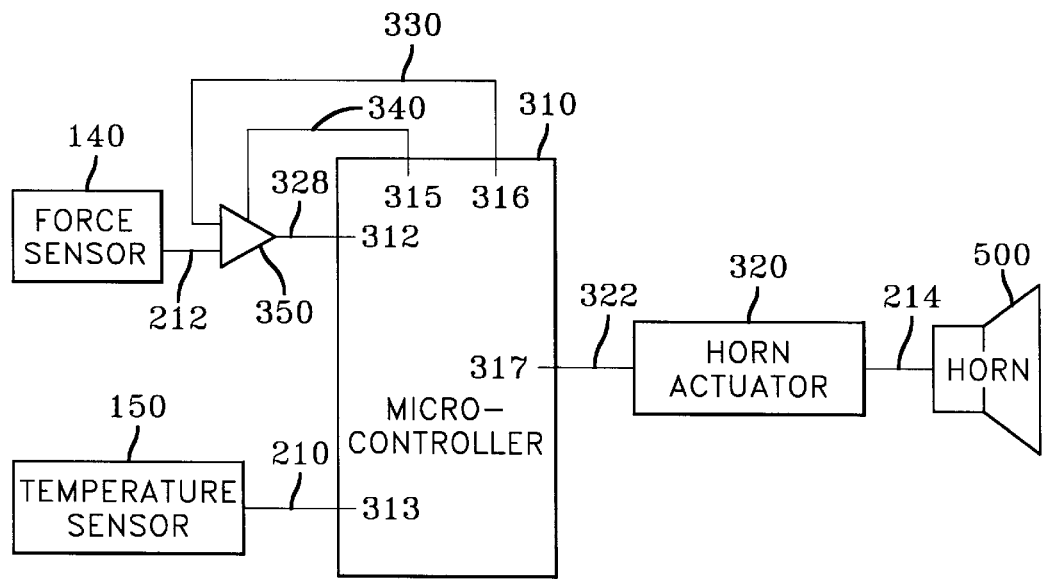
FIG. 6 shows a block diagram of the amplifying and offsetting electronics circuitry for a temperature and preload compensated vehicle horn switch.

Turning now to FIG. 6, FIG. 6 shows a block diagram of the amplifying and offsetting electronics circuitry for a temperature and preload compensated vehicle horn switch. A force sensor 140 provides a force signal 212 to the input of an amplifier 350 having adjustable amplifying and offsetting capability. The amplifier 350 provides a compensated force signal 328 to a first input 312 of a programmable microcontroller 310. A temperature sensor 150 provides a temperature signal 210 to a second input 313 of the programmable microcontroller 310. The programmable microcontroller 310 provides an amplifying control signal 340 to the amplifier 350 from a first output 315, and an offsetting control signal 330 to the amplifier 350 from a second output 316. The programmable microcontroller 310 also provides a horn activating signal 322 to a horn actuator 320 from a third output 317. The horn actuator 320 provides a horn actuating signal 214 to a horn 500. The operation of the programmable microcontroller 310 may be described by six steps. The programmable microcontroller 310 first reads the compensated force signal 328 at the first input 312 of the programmable microcontroller 310 to determine if the compensated force signal 328 exceeds a predetermined threshold value, indicating an actuating compensated force signal. Second, if the compensated force signal 328 exceeds the threshold value in the first step indicating an actuating compensated force signal, the programmable microcontroller 310 activates the third output 317 to generate a horn activating signal 322 and returns to the first step. Third, if the compensated force signal 328 is less than the threshold value in the first step indicating a quiescent compensated force signal, the programmable microcontroller 310 deactivates the third output 317 to silence the horn 500. Fourth, the programmable microcontroller 310 adjusts the offset of the amplifier 350 by energizing the offset control signal 330 from the second output 316 of the programmable microcontroller 310, based on the quiescent compensated force signal 328 from the first step. Fifth, the programmable microcontroller 310 reads the temperature signal 210 at the second input 313 of the programmable microcontroller 310 and adjusts the amplifying of the amplifier 350 by energizing the amplifying control signal 340 from the first output 315 of the programmable microcontroller 310 based on the temperature signal 210. The control signals from the programmable microcontroller 310 are selected by being connected to ground potential by the programmable microcontroller 310. The sixth step is to return to the first step.

Figure 7:
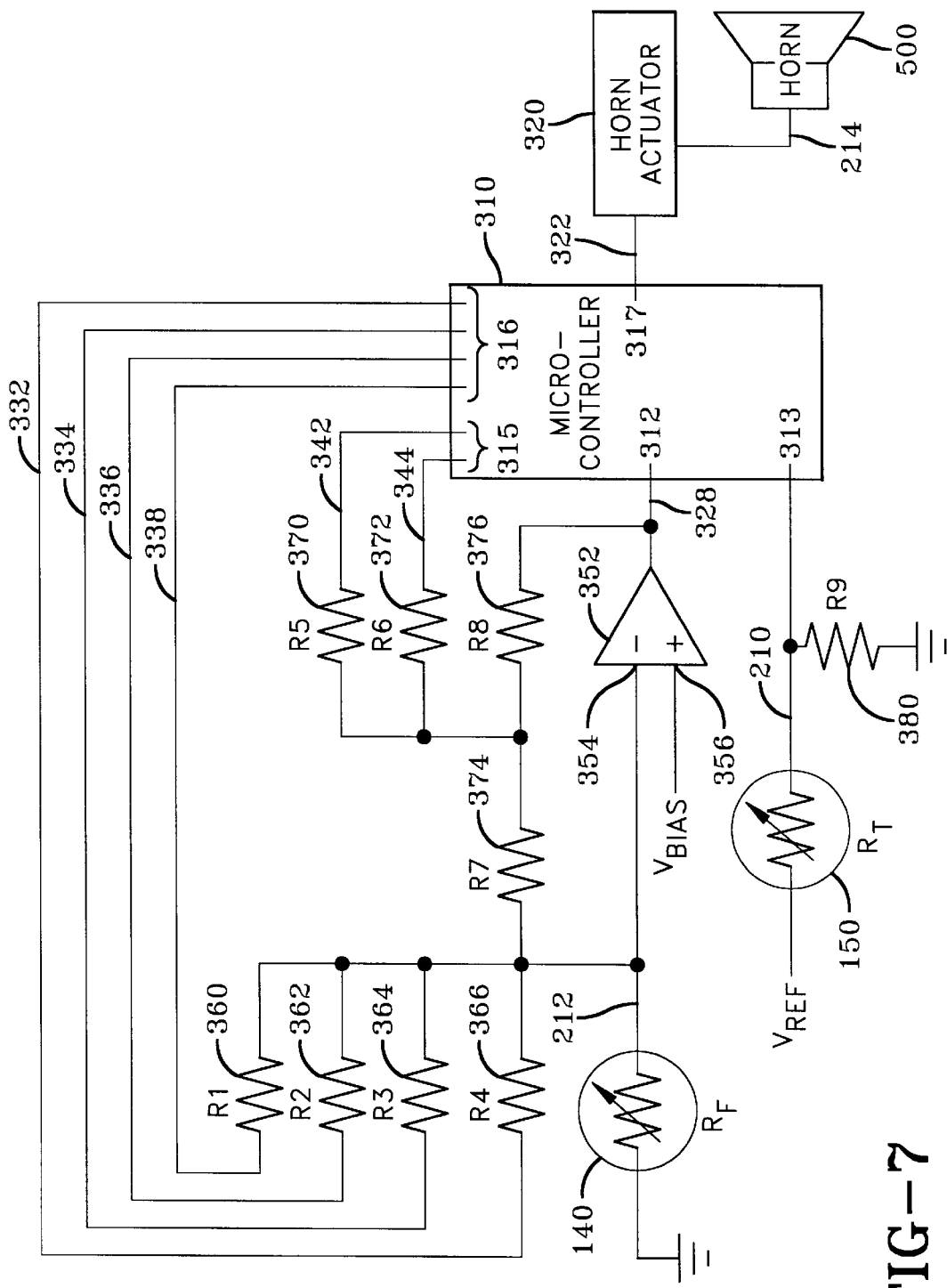
FIG. 7 shows a programmable microcontroller with associated electronic circuitry for a temperature and preload compensated vehicle horn switch.

Turning now to FIG. 7, a preferred embodiment of the device is shown in accordance with the present inventive concepts. FIG. 7 shows a programmable microcontroller with associated electronic circuitry for a temperature and preload compensated vehicle horn switch. A force sensor 140 provides a force signal 212 to the negative input 354 of a biased inverting operational amplifier 352. The opposite side of the force sensor is connected to a ground potential. The negative input 354 of the biased inverting operational amplifier 352 is also connected to an offsetting input resistor network that determines the offsetting of the biased inverting operational amplifier 352, comprising resistor R1 360, resistor R2 362, resistor R3 364, and resistor R4 366. The offsetting input resistor network is controlled by a second output 316 of the programmable microcontroller 310, the second output 316 being connected to a first offset control line 332 connected to resistor R4 366, a second offset control line 334 connected to resistor R3 364, a third offset control line 336 connected to resistor R2 362, and a fourth offset control line 338 connected to resistor R1 360. The opposite side of the resistors are connected together and connected to the negative input 354 of the biased inverting operational amplifier 352. A positive input 356 of the biased inverting operational amplifier 352 is connected to a bias voltage. The biased inverting operational amplifier 352 provides a compensated force signal 328 to a first input 312 of the programmable microcontroller 310. A temperature sensor 150 provides a temperature signal 210 to a second input 313 of the programmable microcontroller 310 and to one side of a voltage divider resistor R9 380, the opposite side of resistor R9 380 being connected to ground potential. The temperature sensor 150 and the resistor R9 380 form a voltage divider configuration that is commonly used with temperature sensors. The opposite side of the temperature sensor 150 is connected to a reference voltage. An amplifying determining feedback resistor network comprising resistor R5 370, R6 372, R7 374, and R8 376 is connected between the negative input 354 and the output of the biased inverting operational amplifier 352. It should be understood that while the preferred embodiment described above utilizes individual resistors and control lines for the gain and offset networks, these functions could also be provided using programmable digital potentiometers such as Xicor's model X9312. The amplifying determining feedback resistor network is controlled from a first output 315 of the programmable microcontroller 310, comprising a first amplifying control signal 342 connected to resistor R5 370 and a second amplifying control signal 344 connected to resistor R6 372. The programmable microcontroller 310 also provides a horn activating signal 322 to a horn actuator 320 from a third output 317. The horn actuator 320 provides a horn actuating signal 214 to a horn 500. The operation of the programmable microcontroller 310 may be described by six steps. The programmable microcontroller 310 first reads the compensated force signal 328 at the first input 312 of the programmable microcontroller 310 to determine if the compensated force signal 328 exceeds a predetermined threshold value, indicating an actuating compensated force signal. Second, if the compensated force signal 328 exceeds the threshold value in the first step indicating and actuating compensated force signal, the programmable microcontroller 310 activates the third output 317 and generates a horn activating signal 322 and returns to the first step. Third, if the compensated force signal 328 is less than the threshold value in the first step indicating a quiescent compensated force signal, the programmable microcontroller 310 deactivates the third output 317 to silence the horn 500. Fourth, the programmable microcontroller 310 adjusts the offset of the biased inverting operational amplifier 352 by selectively energizing the control lines of the second output 316 of the programmable microcontroller 310, comprising the first offset control signal 332, the second offset control signal 334, the third offset control signal 336, and the fourth offset control signal 338. The selection of energizing control lines of the second output 316 of the programmable microcontroller 310 is based on the quiescent compensated force signal 328 from the first step. Fifth, the programmable microcontroller 310 reads the temperature signal 210 at the second input 313 of the programmable microcontroller 310 and adjusts the amplifying of the biased inverting operational amplifier 352 by selectively energizing the first amplifying control signal 342 and the second amplifying control signal 344 from the first output 315 of the programmable microcontroller 310 based on the temperature signal 210. The control signals from the programmable microcontroller 310 are selected by being connected to ground potential by the programmable microcontroller 310. The sixth step is to return to the first step.

Figure 8:
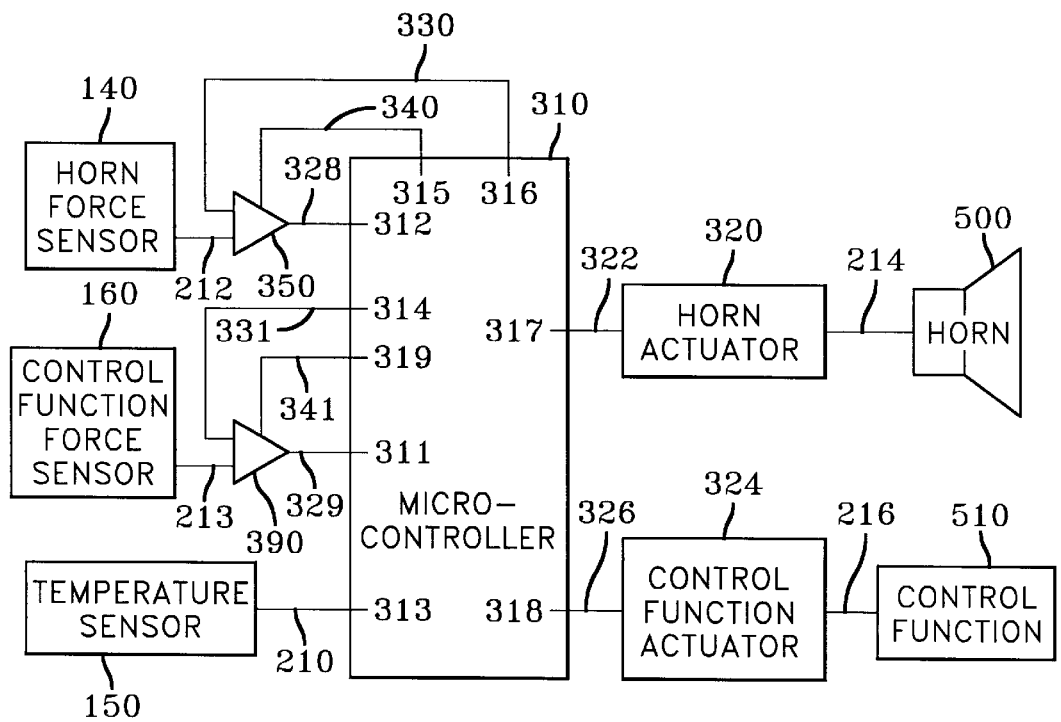
FIG. 8 shows a block diagram of the amplifying and offsetting electronics circuitry for a temperature and preload compensated vehicle horn and control function switch.

Turning now to FIG. 8, an alternate embodiment of the lift device 1, is shown in accordance with the present inventive concepts. FIG. 8 shows a block diagram of the amplifying and offsetting electronics circuitry for a temperature and preload compensated vehicle horn and control function switch. Although FIG. 8 depicts only one control function force sensor and one control function actuator, it is apparent to one skilled in the relevant art that there could be a plurality of control function force sensors and a corresponding plurality control function actuators as well. A horn force sensor 140 provides a force signal 212 to the input of an amplifier 350 having adjustable amplifying and offsetting capability. The amplifier 350 provides a compensated force signal 328 to a first input 312 of a programmable microcontroller 310. A control function force sensor 160 provides a force signal 213 to the input of an amplifier 390 having adjustable amplifying and offsetting capability. The amplifier 390 provides a compensated force signal 329 to a third input 311 of the programmable microcontroller 310. A temperature sensor 150 provides a temperature signal 210 to a second input 313 of the programmable microcontroller 310. The programmable microcontroller 310 provides an amplifying control signal 340 to the amplifier 350 from a first output 315, and an offsetting control signal 330 to the amplifier 350 from a second output 316. The programmable microcontroller 310 also provides an amplifying control signal 341 to the amplifier 390 from a sixth output 319, and an offsetting control signal 331 to the amplifier 390 from a fifth output 314. The programmable microcontroller 310 also provides a horn activating signal 322 to a horn actuator 320 from a third output 317, and a control function activating signal 326 to a control function actuator 324 from a fourth output 318. The horn actuator 320 provides a horn actuating signal 214 to a horn 500 and the control function actuator 324 provides a control function actuating signal 216 to a control function 510.

Figure 9:
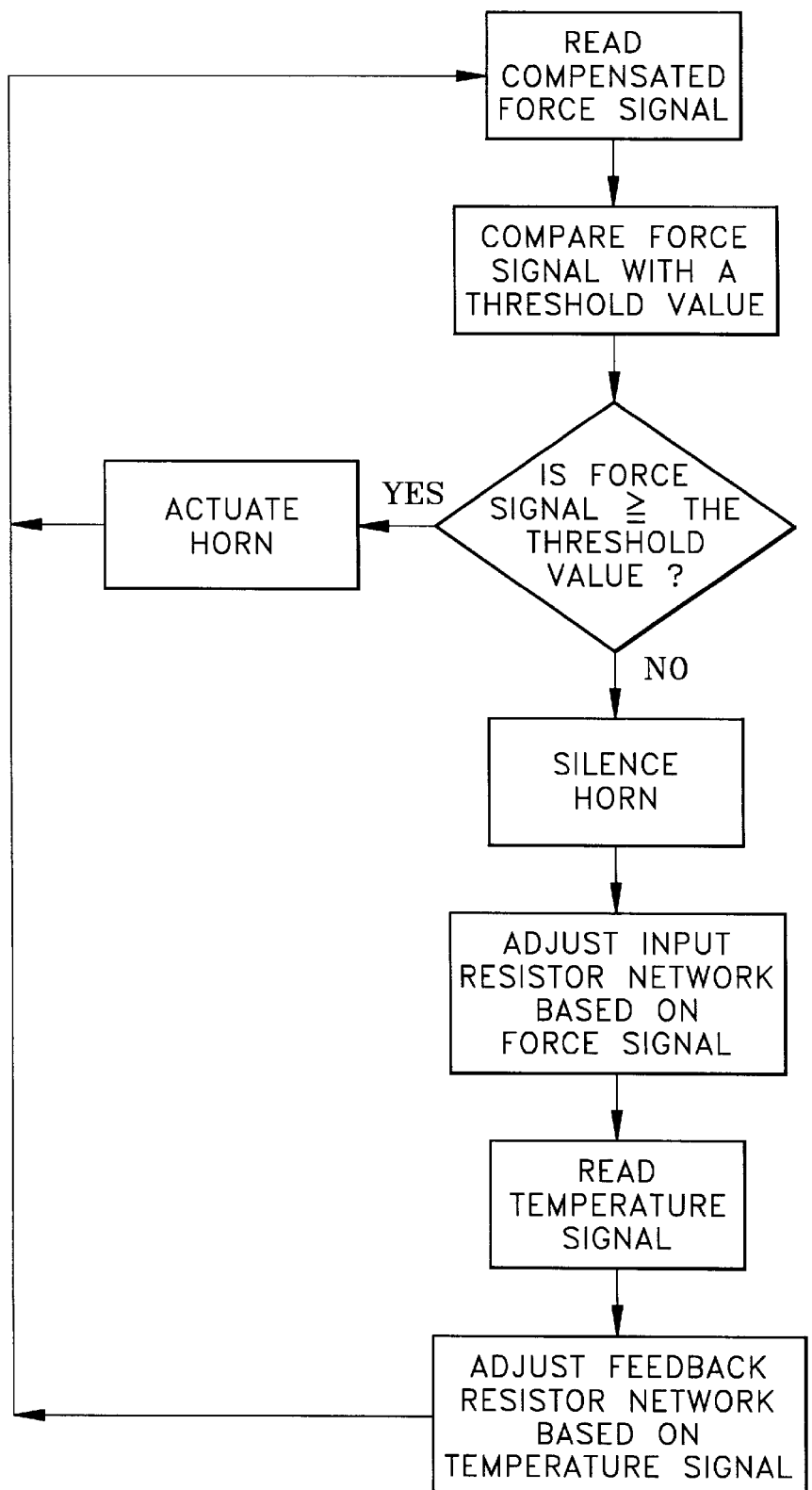
FIG. 9 shows a flow chart that depicts the sequence of operational steps performed by the programmable microcontroller.

Turning now to FIG. 9, FIG. 9 shows a flow chart that depicts the sequence of operational steps performed by the programmable microcontroller. The first step performed by the programmable microcontroller is to read a compensated force signal. The compensated force signal is then compared to a predetermined threshold value. If the compensated force signal is equal to or greater than the predetermined threshold value indicative of an actuating compensated force signal, the horn is actuated and control is returned to the first step. If the compensated force signal is less than the predetermined threshold value indicative of a quiescent compensated force signal, the horn is silenced. Next, the programmable microcontroller selects output control signals to adjust an input resistor network of a biased inverting operational amplifier to provide offset compensation based on the quiescent compensated force signal. Next, the programmable microcontroller reads a temperature signal. The programmable then selects output control signals to adjust a feedback resistor network of a biased inverting operational amplifier to provide amplifying compensation based on the temperature signal. Control is then returned to the first step.

Advantages of the present invention include reliable operation over extreme temperature ranges and a compensation scheme that accounts for changes in preload forces resulting from the manufacturing process or vehicle component material aging. This temperature and preload compensation scheme also reduces the resolution requirements of the electronic circuitry resulting in reduced costs. By providing dynamic compensation, the compensation scheme also enables optimization of the dynamic range of the force signal at the input to the programmable microcontroller. This arrangement also provides for ease of initial setup in the manufacturing operation. The result is an apparatus that is easily and inexpensively fabricated, assembled, tested, calibrated, and installed.

Although the present invention has been described in considerable detail with reference to certain preferred embodiments thereof, other embodiments are possible. Therefore, the spirit and scope of the appended claims should not be limited to the description of the preferred embodiments herein.

What is claimed is:

1. A vehicle horn and control function switch, comprising:
  (a) a means for measuring a force applied to a surface of a steering wheel and generating a force signal;
  (b) a means for measuring a temperature of the surface of the steering wheel and generating a temperature signal;
  (c) a means for receiving the force signal and amplifying and offsetting the force signal;
  (d) a means for receiving the temperature signal and compensating the amplifying and offsetting of the force signal depending upon the temperature signal and a quiescent force signal; and
  (e) a means for determining when the compensated force signal exceeds a threshold value and actuating a horn.

2. A vehicle horn and control function switch, according to claim 1, wherein the means for measuring a force applied to a surface of a steering wheel is a pressure sensor.

3. A vehicle horn and control function switch, according to claim 1, wherein the means for measuring a force applied to a surface of a steering wheel is a force sensing resistive device.

4. A vehicle horn and control function switch, according to claim 1, wherein the means for measuring a temperature of the surface of the steering wheel is a temperature sensor.

5. A vehicle horn and control function switch, according to claim 1, wherein the means for measuring a temperature of the surface of the steering wheel is a thermistor.

6. A vehicle horn and control function switch, according to claim 1, wherein the means for amplifying and offsetting the force signal is a biased inverting operational amplifier with adjustable offset and gain.

7. A vehicle horn and control function switch, according to claim 1, wherein the means for receiving the temperature signal and compensating the amplifying and offsetting of the force signal is a programmable microcontroller.

8. A vehicle horn and control function switch, according to claim 1, wherein the means for receiving the temperature signal and compensating the amplifying of the force signal is by a programmable microcontroller that selects resistors in a feedback network of a biased inverting operational amplifier based on the received temperature signal, the compensated force signal at the biased inverting operational amplifier output being applied to an input of the programmable microcontroller.

9. A vehicle horn and control function switch, according to claim 8, wherein the resistors in a feedback network are a programmable digital potentiometer in a feedback network.

10. A vehicle horn and control function switch, according to claim 1, wherein the means for receiving the temperature signal and compensating the offsetting of the force signal is by a programmable microcontroller that selects resistors in an input network of a biased inverting operational amplifier based on the received quiescent force signal, the compensated force signal at the biased inverting operational amplifier output being applied to an input of the programmable microcontroller.

11. A vehicle horn and control function switch, according to claim 10, wherein the resistors in an input network are a programmable digital potentiometer in an input network.

12. A vehicle horn and control function switch, according to claim 1, wherein the means for determining when the compensated force signal exceeds a threshold and actuating a horn is a programmable microcontroller.

13. A vehicle horn and control function switch, according to claim 1, wherein element (e) further comprises a means for determining when the compensated force signal exceeds a threshold value and actuating a control function selected from the group consisting of a lighting control function, an audio entertainment control function, a speed control function, and a temperature control function.

14. A method of operation of a vehicle horn and control function switch, comprising the steps of:

(a) measuring a force applied to a surface of a steering wheel and generating a force signal;

(b) measuring a temperature of the surface of the steering wheel and generating a temperature signal;

(c) receiving the force signal and amplifying and offsetting the force signal;

(d) receiving the temperature signal and compensating the amplifying and offsetting of the force signal depending upon the temperature signal and a quiescent force signal; and (e) determining when the compensated force signal exceeds a threshold value and actuating a horn.

15. A method of operation of a vehicle horn and control function switch, according to claim 14, wherein step (c) comprises the steps of:

(a) applying the force signal to an input of a biased inverting operational amplifier;

(b) adjusting the amplifying of the force signal by selecting resistors in a feedback network of the biased inverting operational amplifier; and (c) adjusting the offsetting of the force signal by selecting resistors in an input network of the biased inverting operational amplifier.

16. A method of operation of a vehicle horn and control function switch, according to claim 14, wherein step (d) comprises the steps of:

(a) applying the temperature signal to an input of a programmable microcontroller;

(b) selecting resistors in an input network of a biased inverting operational amplifier by the programmable microcontroller based on a quiescent force signal; and (c) selecting resistors in a feedback network of the biased inverting operational amplifier by the programmable microcontroller based on the temperature signal.

17. A method of operation of a vehicle horn and control function switch, according to claim 14, wherein step (e) comprises the steps of:

(a) applying the compensated force signal to an input of a programmable microcontroller;

(b) comparing the compensated force signal to a predetermined threshold by the programmable microcontroller; and (c) actuating a horn if the compensated force signal exceeds the predetermined threshold by enabling a horn activating signal from the microcontroller.

18. A vehicle horn and control function switch, comprising:

(a) a force sensing device for measuring a force applied to a surface of a steering wheel and generating a force signal, connected to an input of a biased inverting operational amplifier;

(b) a compensated force signal at the output of the biased inverting operational amplifier connected to a first input of a programmable microcontroller;

(c) a temperature sensing device for measuring temperature of the surface of the steering wheel and generating a temperature signal, connected to a second input of the programmable microcontroller;

(d) an amplifying determining feedback network connected between the output and the input of the biased inverting operational amplifier, the feedback network being controlled from a first output of the programmable microcontroller;

(e) an offset determining input network connected to the input of the biased inverting operational amplifier, the input network being controlled from a second output of the programmable microcontroller;

(f) a third output of the programmable microcontroller connected to an input of a horn actuator; and (g) an output of the horn actuator connected to a horn.

19. A vehicle horn and control function switch, according to claim 18, wherein the force sensing device is a force sensing resistive device.

20. A vehicle horn and control function switch, according to claim 18, wherein the temperature sensing device is a thermistor.

21. A vehicle horn and control function switch, according to claim 18, wherein the feedback network comprises a plurality of resistor elements selectively connected to ground by connections to the first output of the programmable controller.

22. A vehicle horn and control function switch, according to claim 18, wherein the feedback network comprises a programmable digital potentiometer connected to the first output of the programmable controller.

23. A vehicle horn and control function switch, according to claim 18, wherein the input network comprises a plurality of resistor elements selectively connected to ground by connections to the second output of the programmable controller.

24. A vehicle horn and control function switch, according to claim 18, wherein the input network comprises a programmable digital potentiometer connected to the second output of the programmable controller.

25. A vehicle horn and control function switch, according to claim 18, wherein the programmable microcontroller performs the steps of:

(a) reading the compensated force signal connected to the first input of the programmable microcontroller;

(b) comparing the compensated force signal with a predetermined threshold value;

(c) actuating the horn by activating the third output of the programmable microcontroller and returning to step (a) if the compensated force signal is equal to or greater than predetermined threshold value indicative of an actuating compensated force signal;

(d) silencing the horn by deactivating the third output of the programmable microcontroller if the compensated force signal is less than the predetermined threshold value indicative of a quiescent compensated force signal;

(e) adjusting the selection of the offset determining input network resistors controlled from the second output of the programmable microcontroller based on the quiescent compensated force signal;

(f) reading the temperature signal connected to the second input of the programmable microcontroller;

(g) adjusting the selection of the amplifying determining feedback network resistors controlled from the first output of the programmable microcontroller based on the temperature signal; and (h) returning to step (a).

* * * * *